United States Patent [19]

Scott et al.

[11] Patent Number: 4,793,908
[45] Date of Patent: Dec. 27, 1988

[54] MULTIPLE ION SOURCE METHOD AND APPARATUS FOR FABRICATING MULTILAYER OPTICAL FILMS

[75] Inventors: Gene Scott, El Toro; Charles W. Kohlenberger, Fullerton; David M. Warren, Chino Hills, all of Calif.

[73] Assignee: Rockwell International Corporation, El Segundo, Calif.

[21] Appl. No.: 947,141

[22] Filed: Dec. 29, 1986

[51] Int. Cl.$^4$ .............................................. C23C 14/46
[52] U.S. Cl. ....................... 204/192.26; 204/192.15; 204/192.11; 204/298
[58] Field of Search ............... 204/192.12, 192.15, 204/192.16, 192.18, 192.22, 192.23, 192.26, 192.11, 298; 250/492.3

[56] References Cited

U.S. PATENT DOCUMENTS

| | | | |
|---|---|---|---|
| 4,033,843 | 7/1977 | Kriokorian et al. | 204/298 X |
| 4,108,753 | 8/1978 | King | 204/298 X |
| 4,142,958 | 3/1979 | Wei et al. | 204/298 X |
| 4,250,009 | 2/1981 | Cuomo et al. | 204/298 X |
| 4,278,493 | 7/1981 | Petvai | 204/298 X |
| 4,278,890 | 7/1981 | Gruen et al. | 204/298 X |
| 4,416,755 | 11/1983 | Ceasar et al. | 204/298 X |
| 4,581,118 | 4/1986 | Class et al. | 204/298 |

OTHER PUBLICATIONS

C. Weissmantel et al., "Preparation . . . Coatings", Thin Solid Films, 96(1982), pp. 31–44.
Gautherin et al., "Some Trends . . . Methods", Thin Solid Films, 50(1978), pp. 135–144.

*Primary Examiner*—T. Tung
*Assistant Examiner*—Nam X. Nguyen
*Attorney, Agent, or Firm*—H. Fredrick Hamann; George A. Montanye; James F. Kirk

[57] ABSTRACT

A method of fabricating multiple layer, solid, thin films on a substrate having a surface to be coated, the method providing control over the thickness, stoichiometry, and morphology of each separate layer formed by a method comprising steps: A. forming a first ion beam from an inert gas; B, bombarding a target surface with said first ion beam in a vacuum chamber to generate a vapor cloud composed of the target material atoms by the process of sputtering; C. adjusting the respective positions of the substrate surface for coating and the target surface to promote the condensation of the vapor upon the substrate surface for coating; D. forming a second ion beam, the second ion beam's ions being formed from a mixture of inert and reactive gases; E. bombarding the substrate surface simultaneously with the second ion beam to promote a chemical reaction between the target vapor atoms and the chemically reactive gas ions as the target atoms and the chemically reactive gas ions impinge upon the substrate surface for coating, the resulting chemical compound building up in thickness as a homogeneous thin solid film layer; F. positioning an alternative target material in the place occupied by the previous one; G. repeating the above method steps to produce each successive thin solid film layer of different material formed upon each previous layer.

21 Claims, 9 Drawing Sheets

MULTIPLE ION SOURCE METHOD AND APPARATUS FOR FABRICATING MULTILAYER OPTICAL FILMS

BACKGROUND OF THE INVENTION

1. Field of the Invention

The present invention relates to a sputtering apparatus and method for fabricating durable dielectric thin films such as those used for optical, semiconductor, tribological, appearance and other applications such as quarter wave stacks for laser mirrors.

2. Prior Art

Thin films are often fabricated by condensing vapors upon a collecting surface within a vacuum vessel. Vapors of the desirable thin film materials are produced by heating or providing energy in some other manner. Thin films made in this way are used to enhance the properties of the substrates upon which they are deposited, as in the case of anti-reflection coatings on optical lenses.

Thin films are also used for their own intrinsic properties apart from the substrate upon which they rest. Chrome coatings on automobile grills is an example of one such use. Thin beryllium windows for x-ray instrumentation are fabricated using thin film deposition. After deposition, the thin film is parted from the substrate and used alone.

The family of vapor phase processes of which the current method is a member are generally referred to as physical vapor deposition methods. Two methods that are used to convert the parent material into a vapor form are represented as evaporation and sputtering.

The evaporation process involves raising the temperature of the parent material by resistance, inductive or electron beam heating. The material for deposition vaporizes directly, or after melting. A major drawback of this method is that a compound material will usually chemically disassociate allowing the components with highest vapor pressure to vaporize first.

Chemical disassociation produces a thin film whose properties and chemical composition vary throughout the film thickness. For this reason, the evaporation method is primarily limited to the coating of single elements such as copper, aluminum and gold.

By using multiple sources, clustered together, it has been possible to condense more than one element onto a substrate simultaneously, thereby forming alloys. It is also possible to form alloys by holding several elemental components in the liquid state in a common bath, and by controlling the liquid inventory of each, to maintain a vapor cloud composed of these elemental components in a specified ratio.

The sputtering process involves accelerating a population of ions, extracted from a plasma, toward a parent material usually referred to as a target. Under preferred conditions, as the ions collide with the target surface, a significant number of surface atoms are ejected which form a vapor cloud. The pressure in the vessel is held at a level that results in few collisions between the accelerated ions and the ejected vapor atoms. The vapor moves away from the target surface with considerable kinetic energy. If the parent material is a chemical compound or alloy, atoms of each of the constituents are found in the vapor phase and condense upon the substrate. Generally, because all the atomic species necessary to reform the compound or alloy of the target are present in the condensate, the original compound or alloy is reformed in the thin film.

Sputtering is most commonly practiced by filling the vacuum vessel with an inert gas which is then ionized forming a low energy plasma. A negative electrical potential is applied to the target material which then attracts positive ions from the plasma which bombard the target surface causing the sputtering of atoms into the vapor phase. The vapor which is electrically neutral, condenses upon the nearby substrate forming the thin film.

An improved method uses a large area ion beam source to bombard the target surface causing a vapor flux to be generated by sputtering action. The gas pressure in the chamber, e.g. at the substrate surface, using this approach can be in the tenths or hundredths of a millitorr range. This is a great advantage since the finished film tends to contain fewer gas atoms and have an improved grain structure and atomic packing density. An extension of this method uses an elemental target to produce a vapor flux by ion beam bombardment as described above, plus the introduction of a chemically reactive gas into the chamber in order to form a thin film upon the substrate which is a chemical compound of the reaction between the target vapor atoms condensing on the substrate with the reactive gas atoms introduced separately.

This application uses the method described above but introduces a second ion beam source which is used to bombard the substrate directly wtth a gas mixture partly composed of the required reactive gas species. By controlling the parameters associated with this second ion beam, it is possible to improve the physical, electrical, crystal morphology and stoichiometry poopertics of the thin films which are formed. By. controlling certain parameters of the first ion beam and the target and substrate motion, it is possible to improve the uniformity, homogeneity and purity of the thin films.

This application also relates to U.S. Pat. No. 4,142,958, titled "Method for Fabricating Multilayer Optical Films", issued Mar. 6, 1979 for inventors David T. Wei and Anthony W. Louderback and assigned to Litton Systems Inc. of Woodland Hills, Calif. This application provides a novel improvement to the method of the Litton patent of Wei and Louderback.

The authors of the Wei and Louderback '958 patent provided a prior art discussion of quarter wave stacks. A part of that discussion is repeated here for the reader's convenience.

Quarter wave stacks and their design are explained in detail in the Military Standardization Handbook entitled, "Optical Design," MIL-HDBK141, Oct. 5, 1962. Each layer or thin film dielectric coating in a quarter wave stack has a thickness of about one quarter of a wavelength of the light which it is designed to reflect. The number of layers which comprise the quarter wave stack depends on the degree of desired reflectance and the differences in refractive indices of the layers. To increase reflectance, the number of layers and/or the differences in refractive indices may be increased. For mirrors used in ring lasers, the quarter wave stacks generally consist of 17 to 25 quarter wave thin film optical layers deposited on a substrate. Each layer is typically from 500 to 800 Angstroms thick. The layers alternate between a material of high index of refraction and a material of low index of refraction. Typically, the high index material is tantalum pentoxide ($Ta_2O_5$) or titanium dioxide (TiO$_2$) and the low index material is silicon dioxide (SiO$_2$, i.e., quartz).

The principal method of fabricating quarter wave stacks for ring laser mirrors has been to use an electron beam evaporation technique. A substrate on which a reflective stack is to be coated is located inside of a vacuum chamber with a sample of the bulk or target material which is to be deposited. An electron beam focused on the sample material causes localized heating of the material to a point where molecules are evaporated off. These molecules then condense on the other surfaces located in the interior of the vacuum chamber, including the substrate which is being coated.

The process of electron beam evaporation as a means of coating is thoroughly explained in the text, "Physical Vapor Deposition," distributed by Airco Temescal, 2850 7th Street, Berkeley, Calif., 1976.

One problem encountered in using the electron beam evaporation technique is that molecules of the target material condense on the substrate in such a manner that voids are left between them. The resulting coating is less dense than the bulk target material, which results in a difference in the layer's index of refraction making it difficult to control the refractive indices of the stack.

The electron beam technique has the added disadvantage of producing localized high heat concentrations that result in small explosions which throw out larger chunks of the melt including impurities which condense in the layer.

SUMMARY OF THE INVENTION

It is a major object of this invention to provide a method for making multiple layer ion beam sputtered coatings having predetermined physical, electrical, crystal morphology and stoichiometry properties.

It is another object of the invention method to allow the user to control the thickness, stoichiometry, and morphology of each separate layer formed by the method.

The method comprises the steps of forming a first ion beam from an inert gas; bombarding the target surface with the first ion beam in a vacuum chamber to generate a vapor cloud composed of the target material atoms by the process of sputtering; adjusting the respective positions of the substrate surface for coating and the target surface to promote the condensation of the vapor upon the substrate surface for coating; forming a second ion beam, the second ion beam's ions being formed from a mixture of inert and reactive gases; bombarding the substrate surface simultaneously with the second ion beam to promote a chemical reaction between the target vapor atoms and the chemically reactive gas ions as the target vapor atoms and the chemically reactive gas ions impinge upon the substrate surface for coating, the resulting chemical compound building up in thickness as a homogeneous thin solid film layer; positioning an alternative target material in the place occupied by the previous one; and repeating the above method steps to produce each successive thin solid film layer of different material formed upon each previous layer.

DETAILED DESCRIPTION OF THE DRAWINGS

FIG. 1 shows a cross-sectional view of a vacuum chamber apparatus described in PRIOR ART U.S. Pat. No. 4,142,958.

DESCRIPTION OF THE PREFERRED EMBODIMENT

Figure 1:
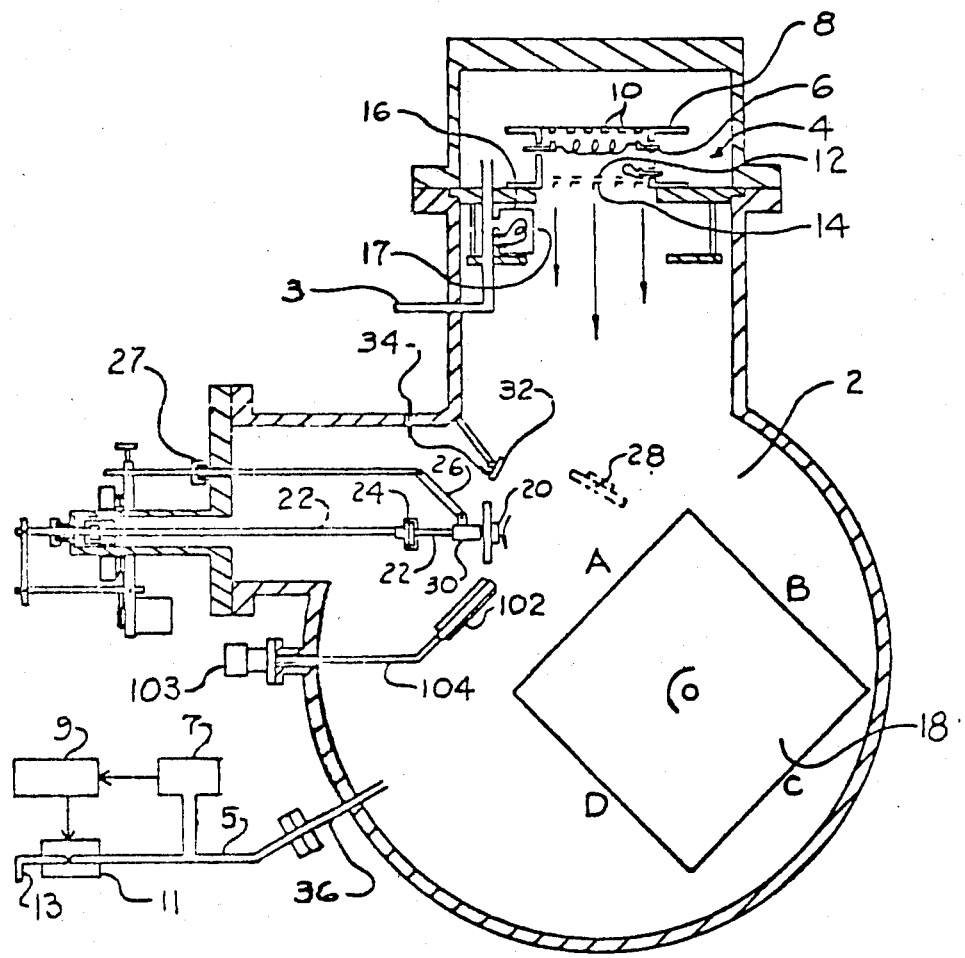

FIG. 1 shows a cross-sectional view of a vacuum chamber apparatus described in U.S. Pat. No. 4,142,958, issued Mar. 6, 1979 to D. T. Wei and A. W. Louderback for "Method for Fabricating Optical Films" and assigned to Litton Systems of Woodland Hills, Calif. This patent teaches a method used for fabricating interference optical films by ion beam sputtering. Vacuum chamber 2 contains argon at about $1.5 \times 10^{-4}$ torr. Argon enters the chamber through tube 3, the argon is released in the chamber in the area of the ion beam gun 4.

FIG. 1 shows the ion beam emanating from gun 4 being directed at surface A of the target turret 18, as indicated by the arrows. Atoms of the target material on surface A are dislodged and are coated onto the surfaces of ceramic substrate 20 inside of the chamber 2. The ceramic substrate 20 comprises a base on which dielectric coatings are to be deposited. This substrate is mounted on the disk at the end of the shaft 22. The substrate typically forms a base for a ring laser gyro mirror. It is typically located near the target 18 inside of the chamber so that it will be in the main stream of the atoms dislodged from target 18. The shaft 22 has a joint 24 so that the angle of the substrate MAY BE varied by moving the bar linkage 26 in and out, i.e. to the right and to the left in FIG. 1 while horizontal in the chamber. The bar linkage is arranged to slide in and out of the vacuum chamber by use of a hermetic seal. By sliding the shaft 22 further into the chamber and adjusting the bar linkage 26 accordingly, substrate 20 is placed directly in the stream of the ion beam and tilted such that the beam strikes the surface of the substrate. This substrate position is illustrated by dashed lines 28.

Sleeve 30 is provided to connect bar linkage 26 to the shaft 22. This sleeve permits the shaft to rotate while being supported by the bar linkage 26. During the coating process, the shaft is rotated at about 60 revolutions per minute.

Oxygen is also present inside of the chamber to insure the proper stoichiometry of the layers deposited onto the base 20.

The target surfaces A, B, C, and D become hot due to the sputtering process. The sputtering rate is temperature dependent, the higher the temperature of the target 18, the higher the rate of the deposition onto the substrate 20 being coated. To control the temperature of the targets A, B, C and D, water is circulated via lines inside of the turret 18 to cool the targets.

Targets A, B, C and D are flat slabs of material at whose surface the ion beam is directed. Atoms of the target material are dislodged from the target surface to form a vapor which condenses onto the substrate 20.

A glass shield 102 is provided inside of the chamber. The shield is rotated into the position shown in FIG. 1 by the apparatus 103 located outside of the chamber. The vacuum chamber to remain sealed while allowing the shaft 104 to rotate the shield.

Operation

Figure 2:
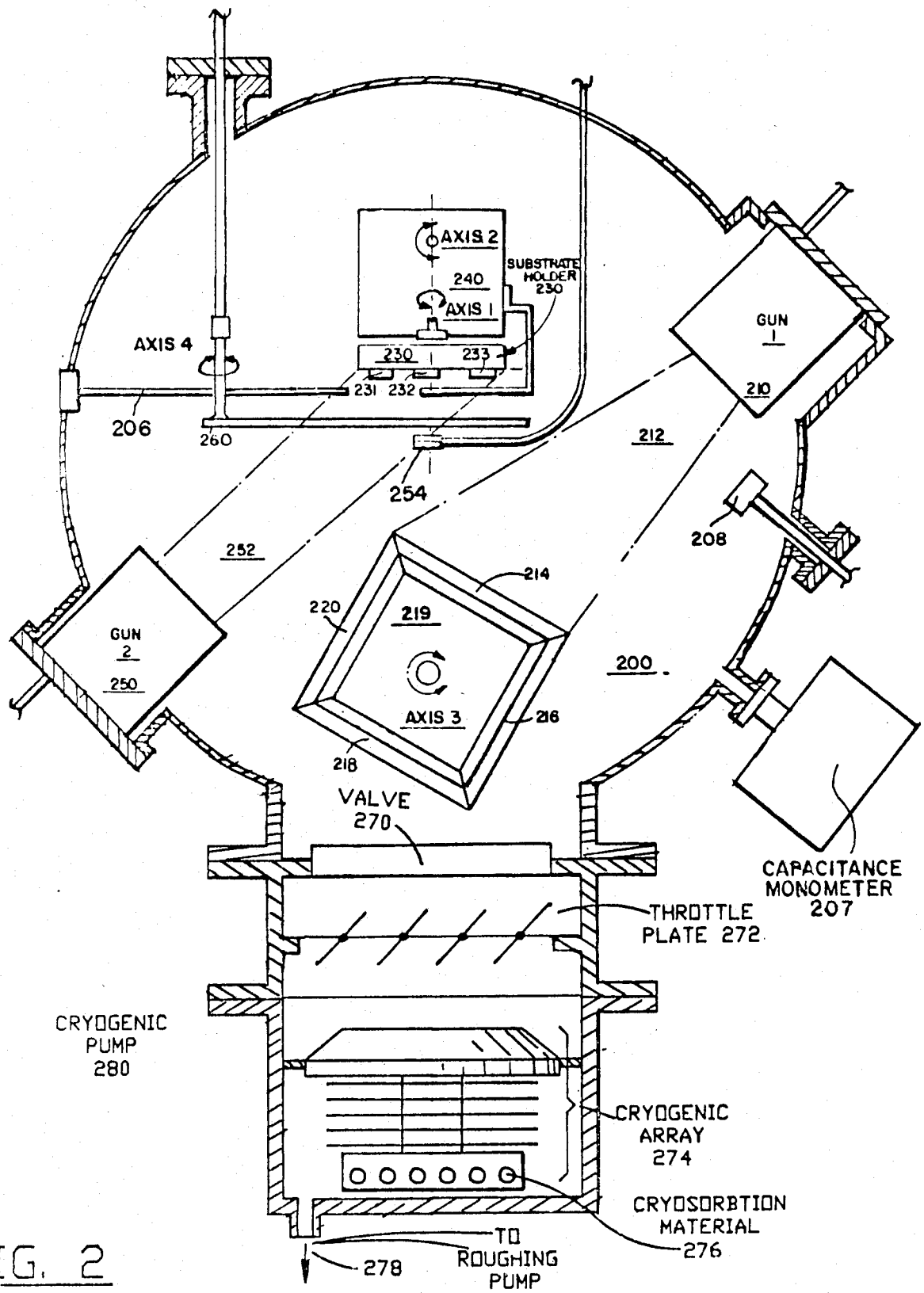
FIG. 2 shows a cross-sectional schematic representation of a chamber apparatus for practicing the invention method.

FIG. 2 is a cross-sectional schematic representation of the apparatus for fabricating multilayer optical films on substrates. In particular, FIG. 2 shows the vacuum chamber apparatus used in performing the invention method of fabricating multiple layer solid thin films on a surface to be coated. The vacuum chamber has an end cover or door that is removable and which serves as a means for obtaining access to the chamber interior, and which is capable of sealing the vacuum chamber. This door or cover is not shown in FIG. 2. The invention method provides control over the thickness and stoichiometry and crystal morphology of each layer formed. The method fabricates mirrors by depositing optical interference film stacks onto optical quality surfaces by ion-beam sputtering technique in high vacuum.

ION BEAM GUN 1, 210 is used to form a first ion beam 212 from an inert gas and bombard a predetermined sequence of targets, such as targets 214, 216, 218 and 220 in a vacuum chamber 200. The first ion beam 212 strikes a target material 214 with high mass inert ions with high predetermined energy, thereby vaporizing the target material. The target vapor moves as a cloud (not shown) to deposit onto a set of substrates which are optical quality surfaces 231, 232 and 233 held within a substrate holder 230. The process is referred to as sputter deposition.

The substrate holder 230 is continuously rotated by substrate holder motor 240 to adjust the respective positions of the substrate surfaces exposed to the vapor. The target surface 214 is also oscillated or partially rotated about AXIS 3 to promote a more uniform vapor cloud which enhances the uniformity of the condensation of the vapor on the substrate surfaces 231, 232, 233 for coating.

As shown in FIG. 2, ION BEAM GUN 2, 250 is used to form a second ion beam 252. The second ion beam's ions are formed from a mixture of inert and reactive gases (not shown in FIG. 2). Oxygen is a typical reactive gas useful in forming multiple layer thin films.

The second ion-beam 252 bombards the substrate surfaces 231-233 directly with high density, low energy, chemically reactive oxygen ions to promote a chemical reaction between the target vapor atoms and the chemically reactive gas ions as the target vapor atoms and the chemically raactive gas ions impinge upon the substrate surfaces for coating. The resulting chemical compound builds up in thickness as a homogeneous thin solid film layer.

The target atoms that condense on the substrate surfaces 231-233 are able to form chemical bonds with the reactive gas ions. The second gun 250 provides control over the arrival rate of reactive ions at the substrate and also the reactive energy available to this process. The ionizing process delivers monoatomic, energetic reactive gas to the growing film, thereby enhancing reactivity at the substrate surfaces 231-233.

FIG. 2 shows horizontal tube 206. Reactive gas, such as oxygen, can be introduced into the chamber via horizontal tube 206. The flow rate of gas passing into the chamber via tube 206 is controlled using a gas source and control means similar to those to be described in connection with FIG. 4.

The interference film stacks typically consist of alternating layers of the oxides of silicon and titanium. The targets 214-220, that are sputter vaporized, are fabricated of high purity elemental silicon and titanium. Compound formation occurs at the solid surface in conjunction with film growth. Control of the ion density from beam 252 and the energy level provides control over critical film characteristics including refractive index, morphology, which includes molecular structure and density, stoichiometry and film purity.

The apparatus described in the FIGS. 2, 2a, 3, 4, 5, 5a, 6, 6a, and 7 is suitable for ion beam sputtering of any solid target material. The process described here will be found useful for deposition of thin film layers onto ceramic substrates to produce highly reflective laser mirrors of quarter wave thick layers of alternately high and low index of refraction materials. This process is useful for the fabrication of highly reflective laser mirrors or layers to reflect laser beams or other narrow bandpass light energy. However, the process is not necessarily limited to the fabrication of highly reflective laser mirrors.

The chamber is capable of high temperature bake and ultra high vacuum evacuation i.e. to the low $10^{-10}$ torr region. This is the primary means used to reduce residual gas levels in the chamber and thus in the film formation to below 1 PPM.

Figure 2B:
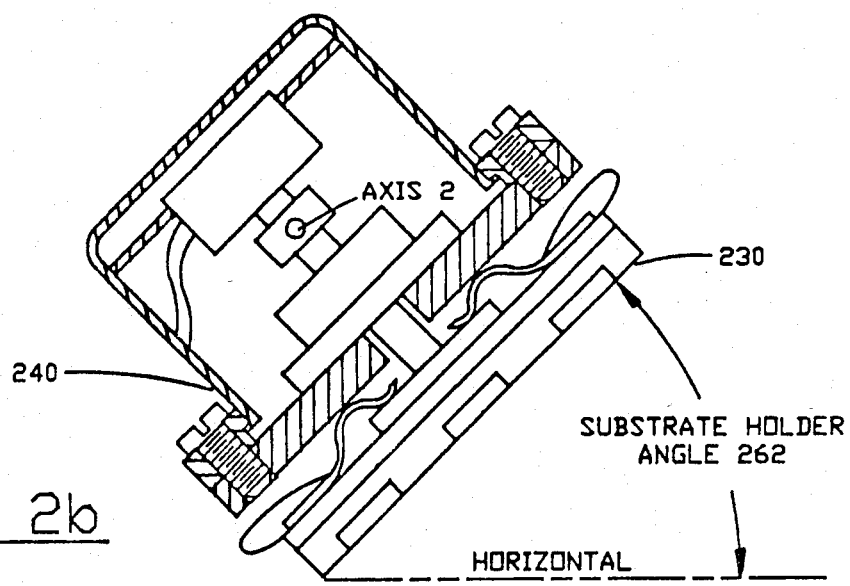
FIG. 2b is a front sectional view of the drive mechanism housing showing substrate holder angle from rotation on AXIS 2.

As shown in FIG. 2, the invention method is practiced using a unique optimization of the physical positions of the two ion beam sources 210, 250, the target 219 and substrate holder 230, coupled with control of the substrate holder's angle with the horizontal as shown in FIG. 2b. The control of the substrate holder 230 rotation about vertical axis No. 1, the target angle and dither range and rate contribute to optimizing the invention method. The process is capable of extreme uniformity across the substrate holder 230 diameter, as well as optimizing the rate of film formation thereby minimizing residual gas content incorporation in the film structure.

The first and second ion beam guns 210, 250 are both equivalent commercially available ion emitting apparatus generally known in the art as a Kaufman type ion beam source such as those available from the ION TECH, INC. company at Ft. Collins, Colo., 80522.

Figure 7:
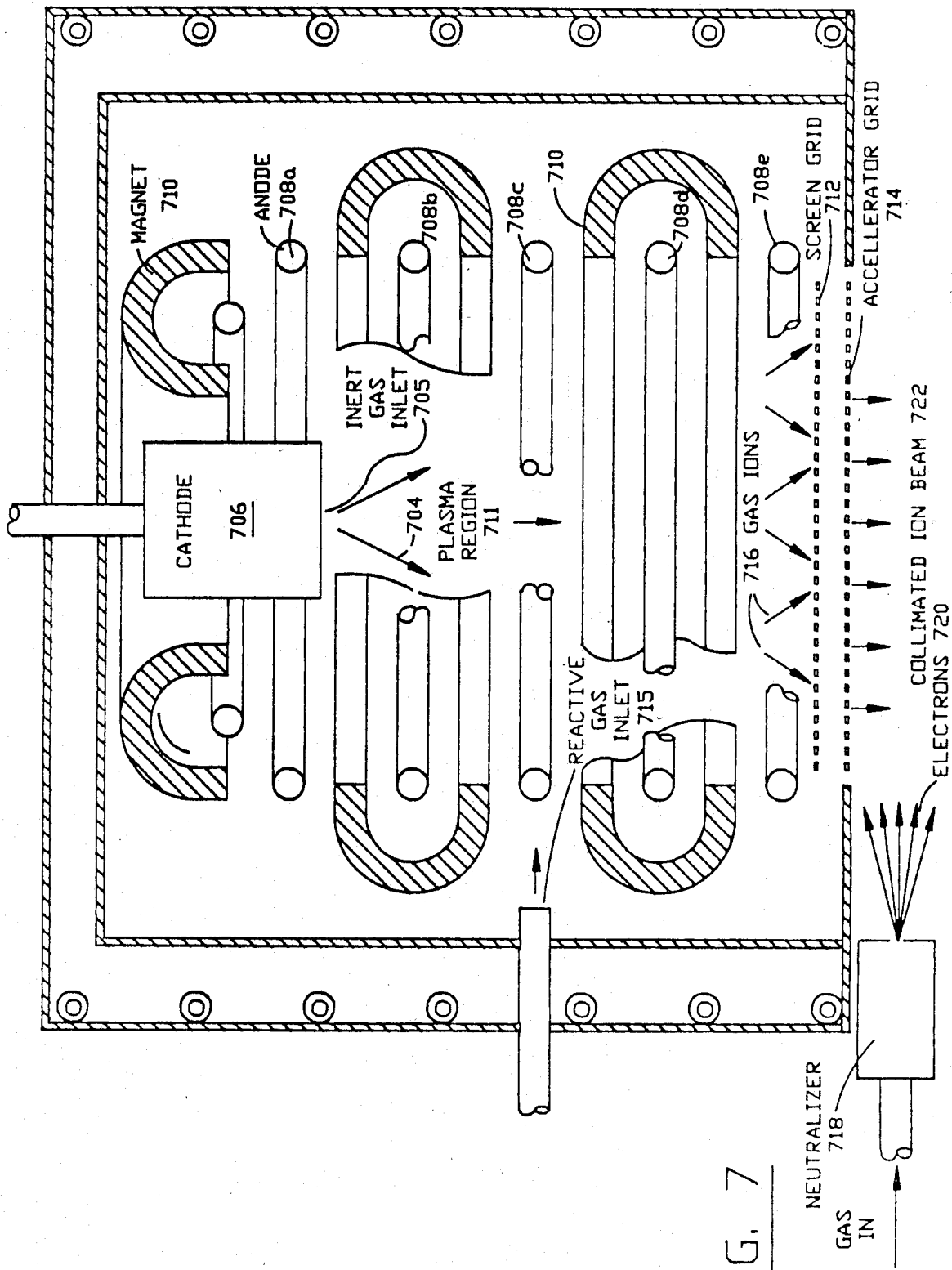
FIG. 7 is a schematic representation of the large area Kaufman type ion beam source.

FIG. 7 is a detailed schematic representation of the Kaufman broad beam ion source showing the relative position of the guns' internal components. The source's cathode 706 is a thermonic emitter. It emits electrons represented by arrows 704 by passing an electric current through a wire within cathode 706 (not shown) to heat it to incandescence. A low work function material within cathode 706 is heated by the wire and emits electrons which are accelerated towards a return electrode at the source cathode window within cathode 706 (not shown but near inert gas inlet 705). The electrons are accelerated from cathode 706 to the several anodes 708. Permanent bar magnets 710, attached to anode 708, introduce a magnetic field into the area between the cathode 706 and the anode 708 which cause the electrons, traveling towards the several anodes, to spiral. This spiral motion effectively increases the distance which the electrons travel in reaching any anode surface and thereby increases the probability of an atom ionization through electron collision.

In the space between the cathode 706 and several anodes 708, electron and atom collisions cause ionizations to occur which results in a glowing plasma in region 711. The difference in voltage between the two grids 712 ano 714 is typically adjusted to be in a range of from 500 to 1500 volts so that the gas ions represented by arrows 716 passing between the two grids are accelerated at a high velocity away from the plasma and out of the gun. These ions form a collimated ion beam 722.

A hollow cathode electron emitter, NEUTRALIZER 718 is positioned near the ion beam 722 at the bottom of FIG. 7 and provides neutralizing electrons 720 so that both ion beams carry no net charge.

The COLLIMATED ION BEAM 722 has an intensity of approximately 100 milliampere. The ions have an average potential of typically 1000 volts with respect to the chamber walls. Beam intensity depends upon the cathode current, the voltage between anode 708 and cathode 706, an the partial pressures of the gases inside of the chamber. The cathode heater current is typically 5 amps within the cathode while the voltage between the anode 708 and cathode 706 ranges from 40 to 80 volts. The cathode to anode current is typically 300 nano-amps. The inert gas partial pressure is $4 \times 10^{-4}$ torr. In addition, oxygen may be introduced into the gun via reactive gas inlet 715 with a partial pressure of about $4.5 \times 10^{-4}$ torr.

Figure 4:
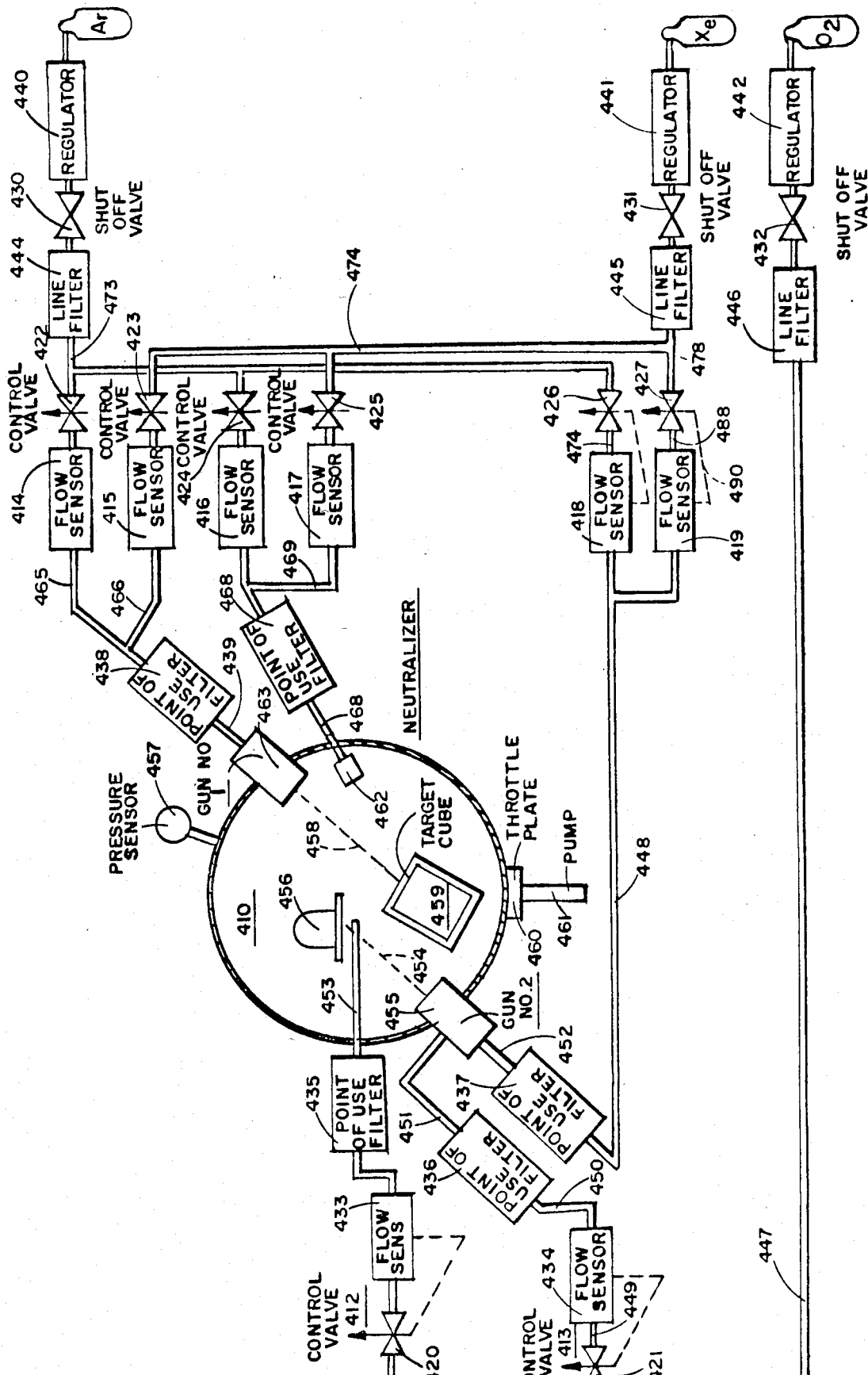
FIG. 4 is a schematic diagram of the gas supply and control mechanism as well as the pressure sensor and throttle plate used to set chamber pressure for the process.

FIG. 4 shows a schematic diagram of the gas controls used in the method. Three gases: argon, xenon and oxygen are introduced through regulators 440, 441, 442, shut-off valves 430, 431, 432, and line filters 444, 445, 446 into flow control valves 422–427 and 412 and 413 and flow sensors 414–419, 433 and 434 filters, 435–438 and 468 to the vacuum vessel 410. Five gas inlets 439, 468, 452, 451, 453 are used.

During the process, a portion of the gas entering the chamber from all five inlets 451, 452, 453, 439, 468 enters the vessel proper, 410, as electrically neutral gas atoms or molecules, unchanged in any way from its form as supplied as a commercially available bottled gas. Ultra-pure gas is preferred to minimize defects in the films formed. The term "Ultra-pure" is an industrially accepted term used to describe the purest gas available commercially in bottled form. Some of the gas which enters gun 1, 463, gun 2, 455 and the neutralizer, 462, is changed in one or more ways, and these changes and their controls constitute an important part of the uniqueness of the method.

As described above, all five gas inlets are supplied from one or more gas control valves 422, 427 and 420, 421 which regulate the quantity of gas passing into the respective inlet 439, 468, 452; 453, 451. Each gas control valve is controlled automatically and continuously by its associated flow sensor 414–419, 433, 434 which is calibrated to sense the quantity of gas of a specific atomic species passing that point in the gas line. These two components, mass flow sensor and flow valve, are close coupled so that they act as a unit to provide flow control for each gas.

As shown in FIG. 4, the argon and xenon gases are mixed by selecting a set point for mass flow for both gas components and allows them to mix just prior to the point of use filter 435–438, 468 at the neutralizer, 462 and guns 1, 462 and 2, 455 The gas mixture is introduced into guns 1 and 2 via the hollow cathode within the gun structure. This results in some gas ionization. In the case of the neutralizer 462, the gas is also partially ionized prior to its injection into the chamber vessel. Oxygen is also introduced into gun 2, however not through the hollow cathode but directly into the gun body. Because of the action of the Kaufman source upon ionized gases within the gun, a portion of the ionized gases is constantly accelerated from the gun in a directed, collimated beam of ions which travels in straight lines to collide with the target surfaces in its path.

All gases entering the chamber vessel, whether as an electrically neutral atom or molecule, or as a charged ion, are eventually removed by a high vacuum pump 461 consisting of cryogenically cooled surfaces which capture gases by condensation and cryosorbtion as they naturally impinge upon its surfaces. Pumping action is continuous because natural diffusion causes new gas molecules to move toward the pump to take the place of captured atoms.

The throttle plate 460 is similar to a venetian blind and is used to set the conductance at the throat of the pump so that chamber pressure may be optimized for the process and also to control pressure transients.

The pressure sensor, 457, operates on the principle of the parallel plate capacitor. Chamber pressure controls the space between the plates of the capacitor. Its advantage is that it measures pressure without regard for the atomic species involved. Therefore any ratio of gas mixtures can be used without regard for calibration error. Pressure sensor 457 provides a continuous external signal which is used to control the throttle plate 460 to maintain a constant chamber pressure.

Referring again to FIG. 2, the invention method proceeds as follows: the substrate holder 230 is loaded with up to 10 substrates which are optical surfaces, 231–233. The substrate holder 230 is mounted onto the drive mecaanism, 240. The chamber is evacuated to the 10E-10 torr region using high vacuum pump 280, thermal bakeout heaters on the outside skin of the chamber (not shown) and interior radiant heaters (not shown). The substrate holder 230 with its substrates 231–233 mounted in place, and the drive mechanism housing 240 is rotated on horizontal axis 2 until the substrate surfaces are at an oblique angle i.e. the substrate holder angle 262, with the ion beam 252. The substrate holder angle 262 is adjusted to be approximately 50 degrees measured counterclockwise from horizontal. The GUN 2 ion beam 252 is positioned to b fixed at approximately 45 degrees measured counterclockwise with horizontal. At this time, substrate holder 230 rotation is started about vertical axis 1. Gun 2, 250 is energized and stabilized, the neutralizer 208 is energized, the shutter 260 is opened by rotation on vertical axis 4, and the substrate surfaces are cleaned and smoothed by the impinging ion bam 252 from GUN 2.

Capacitance Monometer 207 is the pressure sensor represented by reference number 457 described in connection with FIG. 4.

After the substrates are clean, gun 2 and the neutralizer is shut down, the substrate holder 230 and motor housing 240 are rotated about horizontal axis 2, so that substrate angle 262 is approximately zero degrees. Substrate rotation about axis 1 is stopped, and the shutter 260 is rotated about vertical axis 4 to the position shown in FIG. 2, i.e., covering the substrate surfaces 231-233 to be coated. The target cube 219 is then positioned, by rotating, about horizontal axis 3, so that a target 214 is positioned as shown in FIG. 2. Gun 1 is energized, the neutralizer 208 is energized and the target is sputtered to remove any contamination and oxidized materials on its surface. The other targets are cleaned in like manner.

After all targets to be used are cleaned, the target to be used for film layer #1 is positioned in the path of ion beam 1, 212, and both ion beam 1, 212 and ion beam 2, 252 are energized, as is the neutralizer 208. The substrate holder 230 rotation is started, and the shutter 260 is opened. This starts the deposition cycle. The substrate holder 230 is oscillated back and forth, over a small angular excursion, about horizontal axis 2 and the target 214 is oscillated back and forth, over a small angular excursion, about horizontal axis 3, during the coating period. These two oscillations and the rotation of the substrate holder 230 improve the film thickness uniformity across each substrate 233 and additionally between substrates. Uniformity mask 242 is used to improve the uniformity of the thin film thickness. This mask is shaped so that it covers a portion of the substrate holder 230 and allows vapor to condense preferentially, according to the shape of the mask, onto the substrate holder 230 to achieve a uniform thin film thickness. By tailoring the masks shape, it is possible to provide compensation for radial non-uniformities across the substrate holder 230.

The quartz crystal monitor, 254 is positioned in the vapor cloud and monitors the amount of vapor moving past it. This monitor is used to sense the total vapor deposited upon the substrate holder 230 and provides an electrical signal to close the shutter when the film thickness has reached a predetermined setpoint. The shutter 260 then is closed, the ion guns are shut down, and the target cube, 219, is rotated to position another target for sputtering. The process is repeated using up to four different targets in any sequence desired in order to produce thin film stacks upon the substrate exposed surface.

The chamber is constructed specifically to reach ultra-high vacuum by using selected hardware and attachment methods. All chamber seals for electrical, mechanical, coolant and other facility requirements are sealed with metal gaskets. Motion feedthroughs are sealed with magnetic fluid on rotating joints.

Figure 8:
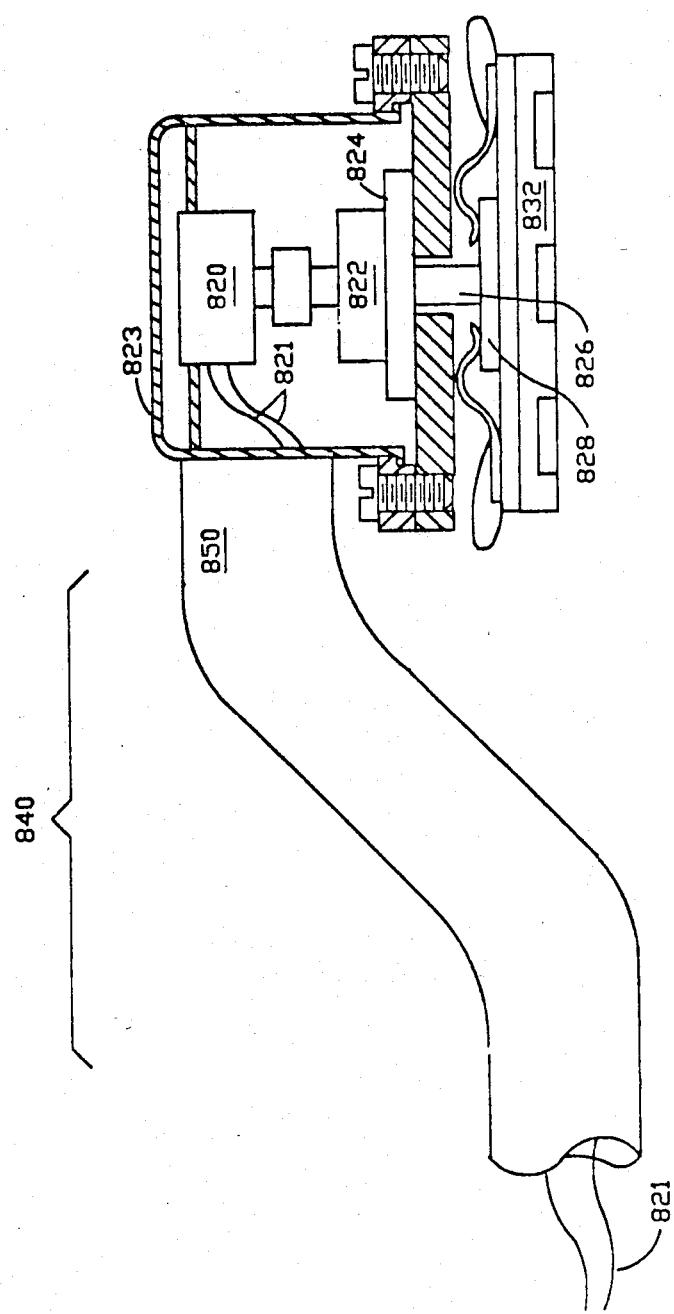

FIG. 8 shows the substrate holder drive motor 820 in greater detail sealed inside a container 823, located within the vacuum vessel. All seals are able to withstand 180 degree Centigrade temperature bake-out on a daily basis. The result is that residual gas levels are held to about 1 ppm in the deposited films.

The substrate holder 832, is oriented so that the substrate surfaces to be coated are facing downward. This avoids film contamination by debris particles moving under the influence of gravity. The drive mechanisms, bearings and all construction elements are designed and selected to minimize particulate generation and distribution. An elaborate set of shields are used to maintain system cleanliness. Hardware design and selection of vessel pumping and venting components permits a slow roughing and backfilling process to keep the movements of existing particulate to an absolute minimum.

The substrate forming the base of the laser mirror is generally an ultra low expansion ceramic material such as Zero-Dur TM, manufactured by Shott Glass, or Cervit TM, manufactured by Owens-Illinois. Other materials may be substituted for the substrate and for the alternating layers of high and low index of refraction materials used for targets and still be within the scope and intent of this invention.

The majority of construction components are made from type 304 stainless steel which is known to have low permeability to all gas species except hydrogen. All components exposed to high vacuum are electro-polished so as to present a chrome-rich smooth surface. Clean pumping techniques are used to evacuate the system and include cryopumping and ion pumping. Rough vacuum is achieved with rotary vane and venturi pumping. Traps and purge gas techniques are used to prevent oil backstreaming. These methods of construction and utilization result in low particulate and residual gas levels in the critical areas of the chamber during processing.

Figure 3:
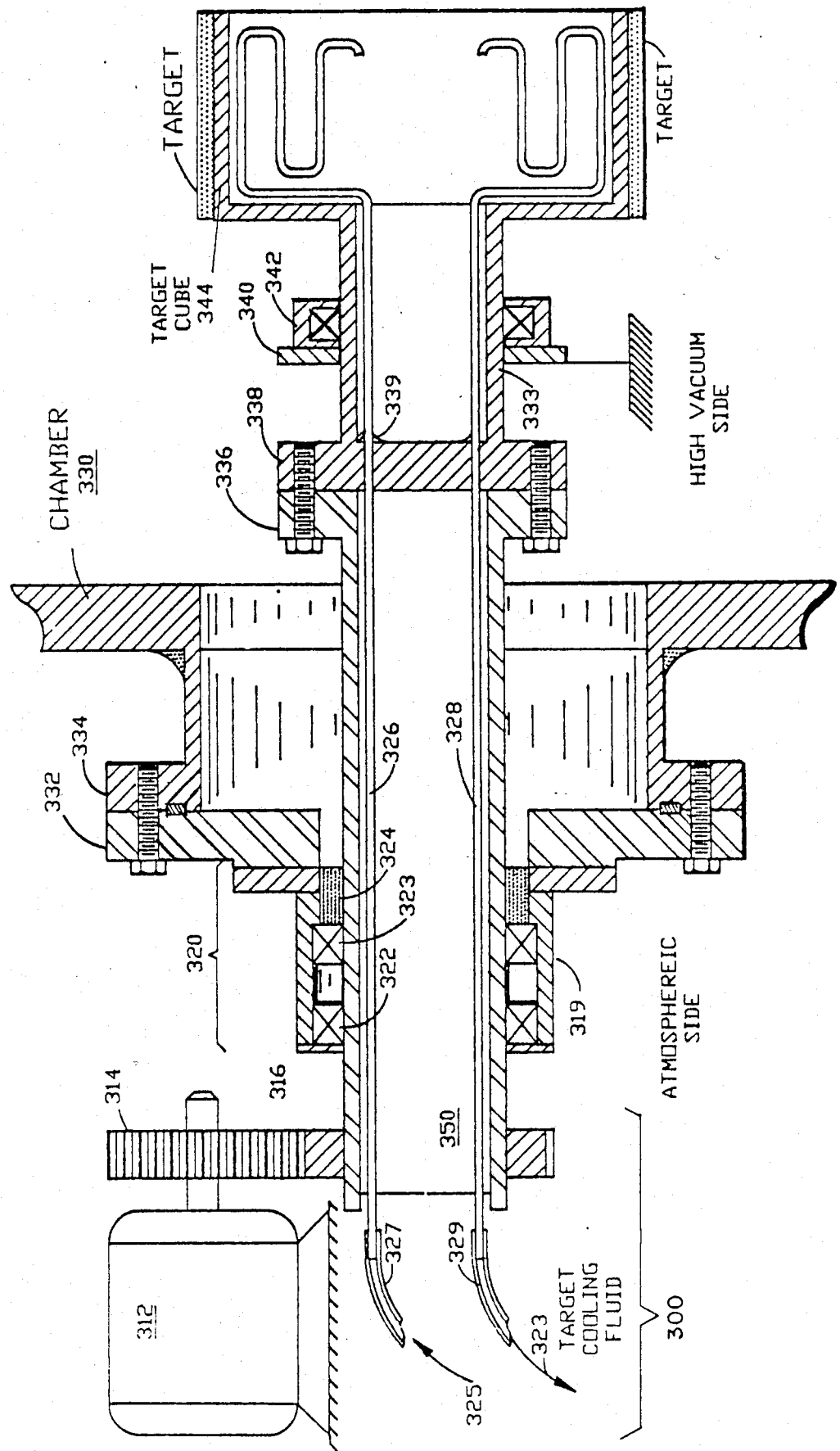
FIG. 3 is a partial side elevation, partial sectional view of the TARGET CUBE, rotational support, sealing and cooling system.

FIG. 3 shows details of the physical mounting and operation of the target cube. A method used to provide rotational access to high vacuum cambers is utilized to actuate the target cube. This method uses a fluid 324, sealed high vacuum feedthrough 319. The flanges are sealed utilizing circular knife edges machined into their surfaces. A copper gasket 333, is positioned between a pair of flanges of this type allowing the flange knife edge to cut into it as the bolts 335, are tightened causing an air tight seal 344 to be made. Provision is made to rotate the target cube 344 by providing a drive motor 312, external to the chamber. This motor acts through the gear set 314 and 316, to drive the hollow shaft 350. This shaft is constrained by, but free to rotate within, the rotational feedthrough 319. This feedthrough is mounted onto a metal gasket sealed flange 332, which mates with the nipple flange 334, welded to the chamber wall 330. The feedthrough contains two bearings 322 and 323 which act to hold the hollow shaft while allowing it to rotate. The high vacuum compatible magnetic fluid 324 is the element which seals the shaft allowing it to rotate while maintaining a high vacuum differential across its surface. The nipple flange 334 is welded to the chamber 330 and therefore allows entry to the chamber through a bored hole in the chamber surface. The high vacuum side of the hollow shaft ends with a conflat flange 336. Atmospheric pressure is sealed at this end of the hollow shaft by mating flange 336 with flange 338 which is welded to a short shaft 333, on the target cube 344. The entire weight of the target cube assembly is held by a bearing set mounted on the chamber interior, 340, 342.

The interior of the target cube is cooled by tubes 326, 329 which are sealed at 339, their point of penetration of the flange 338. Tubes, 326 and 328 are laid within, but not held by the hollow shaft 350. These tubes are connected at the entrance to shaft 350 to flexible lines 327 and 329. Target cooling fluid enters 325, one of the lines and exits 323, the other. The external cooling lines are coiled (not shown) to allow the shaft to rotate up to one full turn in one direction before requiring a return.

FIG. 8 shows details of the drive train for the manipulation of the substrate holder. Provision is made to vary the angle of the substrate holder 832 by providing a drive motor external to the chamber. This motor acts through a gear set identical to that shown in FIG. 3, above bracket 300 to drive the hollow shaft 850. This shaft is mounted and sealed as shown in FIG. 3 above bracket 302. The high vacuum side of the hollow shaft, which contains a dog leg bend, under bracket 840 ends at the substrate holder drive assembly housing 823. The interior of the shaft and the housing are at atmospheric pressure. Fluid carrying cooling tubes are used in the same manner as with the target cube assembly, entering the housing via the shaft. The interior of the housing contains a drive motor 820, which is powered by electrical lines 821, carried within the hollow shaft. The motor is connected mechanically to a fluid sealed feedthrough 822, which is mounted in turn, onto a gasket sealed flange 824. The gasket sealed flange 824 is the means by which the housing assembly is sealed. The feedthrough shaft 826 protrudes out of the housing assembly and contains at its end, a disk-shaped spool 828, upon which the substrate holder 832 is mounted prior to each coating cycle.

Figure 5:
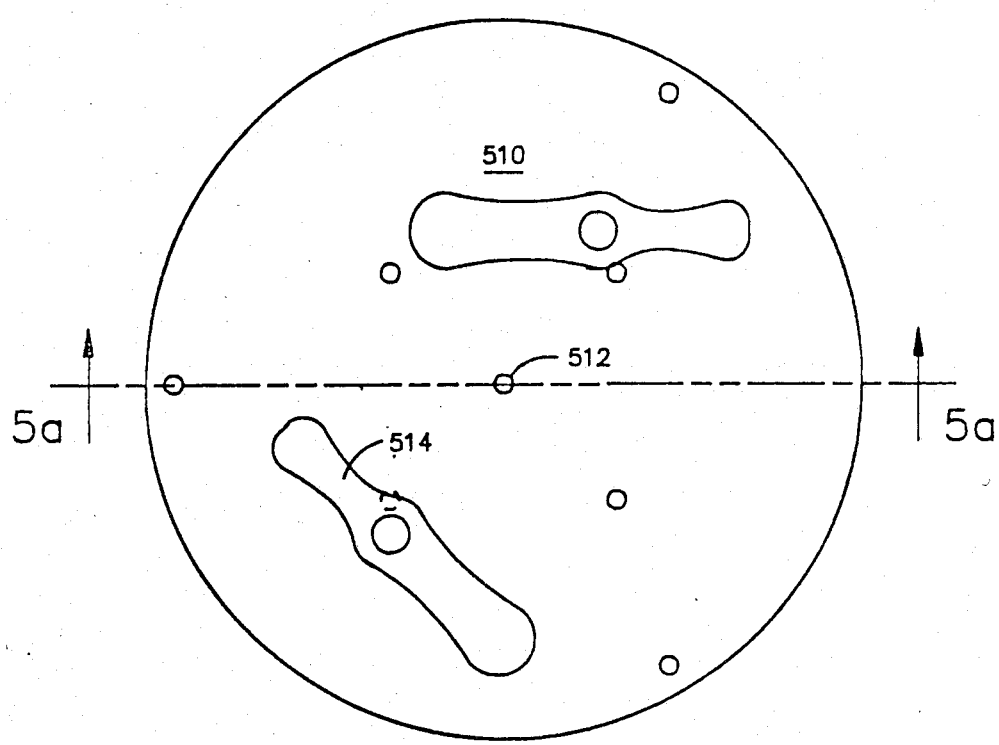
FIG. 5 is a plan view of the cover for the substrate holder.
Figure 5A:
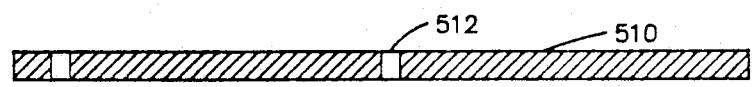
FIG. 5a is a side sectional view of the cover for the substrate holder.
Figure 6:
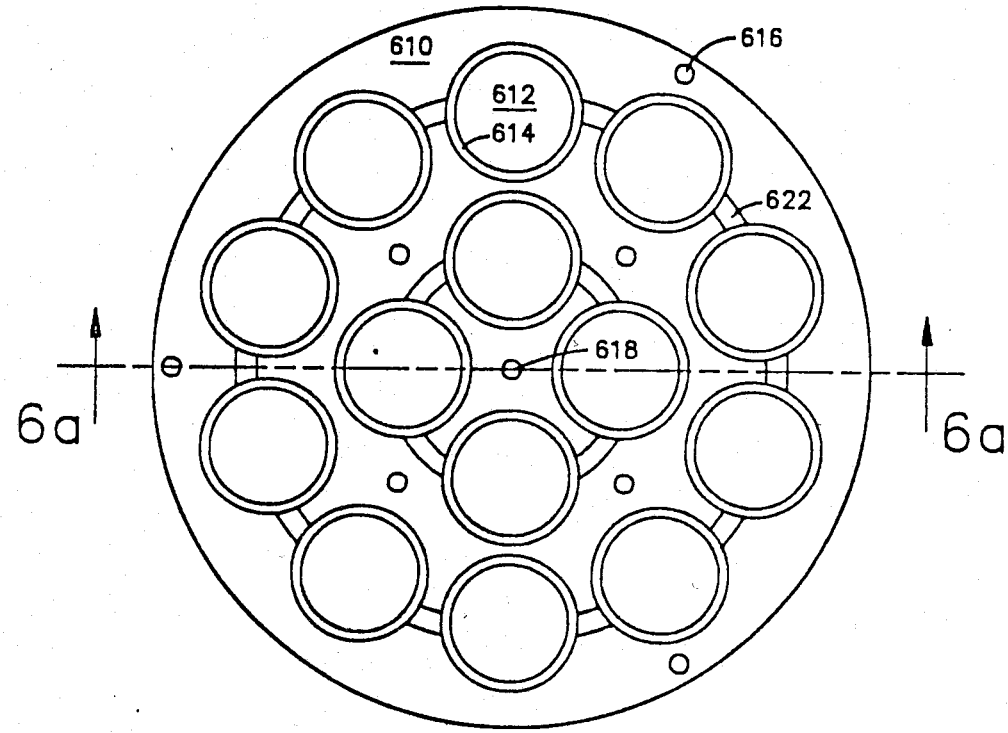
FIG. 6 is a plan view of the substrate holder.
Figure 6A:
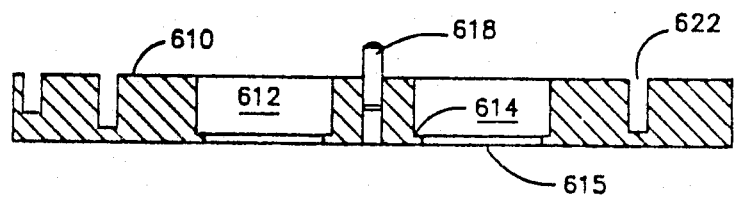
FIG. 6a is a side sectional view of the substrate holder.

FIGS. 6 and 6a show the substrate holder 610 in greater detail. The substrate holder 230 is used to hold the substrates (not shown) during the coating process. The substrate holder 610 has fourteen depressions 612 into which the substrates are placed. The thin shoulder 614 prevents the substrate from falling through the substrate holder 230, yet they are thin enough to provide access to the front surface of the substrate for ion beam cleaning and deposition. A groove 622 interconnects the substrate depression 612, providing space for tweezers for insertion and removal of the substrate at the edge of the substrate. FIGS. 5 and 5a show the substrate cover that mounts onto the back of the loaded substrate holder 230. The substrate cover is positioned by the center hole 512 and is held in place by screws though three peripheral and four interior screws. The two dog ears 514 are used to hold the cover and substrate holder 230 onto the driveshaft spool.

Figure 2A:
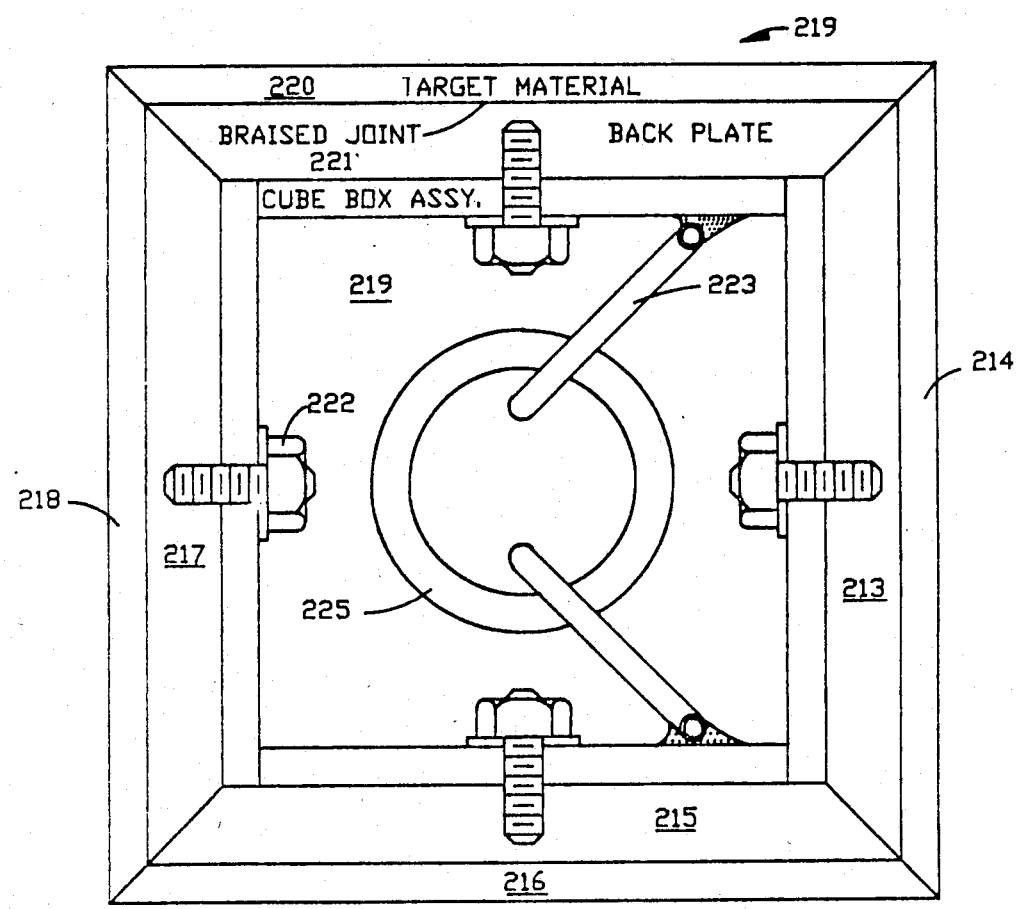
FIG. 2a is a front elevational view of the target cube in FIG. 2.

FIG. 2a shows details of the target cube assembly. The cube box 219 is a six-sided square box open on one end ss shown. Mounted onto four of the outer walls of the box are four target assemblies consisting of four backing plates 213, 215, 217, and 221, each with a target 214, 216, 218, and 220 braised to its outer surface. Each target and its backing plate are chamfered at a 45 degree angle on two sides so that adjacent target surfaces on the exterior of the assembly meet at a smooth hairline intersection at the extreme corner. The backing plates contain tapped holes while the cube box assembly has corresponding clearance holes. Bolts 222 are inserted from the interior of the cube box to hold each target with its backing plate tightly against the cube box surface. The cube box is cooled by fluid carrying coils 223, which enter the cube box from the hollow shaft 225. The coils are brazed to the interior surface of the cube box in order to provide a means for removing the heat generated by ion beam bombardment of the target outer surfaces.

What is claimed is:

1. A method of fabricating multiple layer, solid, thin films on a substrate having a surface to be coated, said substrate being held in a substrate holder, said substrate holder exposing said substrate surface to be coated, the method providing control over the thickness, stoichiometry, and morphology of each separate layer formed by a method comprising steps:
    A. forming a first ion beam from an inert gas;
    B. bombarding a target surface with said first ion beam in a vacuum chamber to generate a vapor cloud composed of target material atoms by the process of sputtering;
    C. forming a second ion beam from a mixture of inert and reactive gases to provide chemically reactive gas ions, said second ion beam being directed at said substrate surface to be coated;
    D. rotating said substrate holder on a first rotational axis at a predetermined rotational rate;
    E. rotating said substrate holder on a second rotational axis to a first predetermined angle to position the surface of said substrates to form a predetermined oblique angle with said second ion beam;
    F. bombarding said substrate surface with said second ion beam and controlling the ion density and ion energy of said second ion beam for cleaning and for smoothing the surface of said substrates;
    G. rotating said substrate holder on said second rotational axis to a second predetermined angle; rotating and oscillating said substrate holder on said first rotational axis;
    H. bombarding said substrate surface simultaneously with said second ion beam and controlling the ion density and ion energy of said second ion beam, the control of the ion density and ion energy of said second ion beam being independent of the control of the ion density and energy of said first ion beam, to promote a chemical reaction between the target material atoms and said chemically reactive gas ions as said target material atoms and said chemically reactive gas ions impinge upon said surface to be coaled, a chemical compound building up in thickness as a homogeneous thin solid film layer;
    I. positioning an alternative target material in the place occupied by the previous one;
    J. bombarding said alternative target material with said first ion beam in said vacuum chamber to generate a vapor cloud composed of alternative target material atoms by the process of sputtering; and
    K. repeating the above method steps H. through J. to produce each successive thin solid film layer of different material formed upon each previous layer.

2. The method of claim 1 further comprising the initial steps of:
    mounting one or more targets on a multisided holder to form the outer face of said target surfaces to be rotated into the path of said first ion beam; and,
    rotatably mounting said multisided holder in the chamber, the multisided holder being rotated to position a target surface into the path of said first ion beam.

3. The method of claim 1 further comprising the initial step of:
    positioning said substrate surface for coating adjacent to a target, the substrate surface to be coated being positioned to be within a line of sight of said target surface.

4. The method of claim 1 wherein said first ion beam is formed from an inert gas mixture of argon and xenon.

5. The method of claim 1 wherein said second ion beam is formed from a mixture of argon, xenon and oxygen gases.

6. The method of claim 1 further comprising the initial step of:
    venting a controlled flow rate of oxygen gas into the immediate region of said substrate to shroud the surface of said substrate in a cloud of oxygen gas during the film formation process.

7. The method of claim 1 further comprising the initial steps of:
  mounting at least two substrates in a holding mechanism, each substrate surface being coplanar for coating to receive the relatively equivalent concurrent layer buildup; and
  moving the holding mechanism in the vapor cloud to optimize film thickness uniformity from one point to the next on each said substrate and also from point to point on neighboring substrates mounted on said holding mechanism.

8. The method of claim 1 further comprising the step of:
  oscillating the target angle with respect to the vapor cloud cyclically to improve the time averaged uniformity distribution of the vapor cloud.

9. The method of claim 1 further comprising the steps of:
  measuring each said solid thin film's thickness growth using a quartz crystal thin film deposition controller; and
  interrupting the film growth in response to said measured thickness exceeding a predetermined limit.

10. The method of claim 8 further comprising the step of:
  positioning a fixed, non-rotating, uniformity mask adjacent to the substrate holding mechanism between the latter and the vapor source; and,
  covering part of the moving substrate holder to improve film thickness uniformity.

11. The method of claim 10 further comprising the step of:
  adjusting the beam current to control the ratio of reactive ions to vapor atoms arriving at the substrate to control both the degree to which the finished film is composed of compound molecules and their stoichiometry.

12. The method of claim 11 further comprising the step of:
  adjusting the ratio of inert to reactive gas components of said second ion beam to control the ratio of reactive ions to vapor atoms arriving at the substrate to establish both the degree to which the finished film is composed of compound molecules and also their stoichiometry.

13. The method of claim 12 further comprising the step of:
  adjusting the beam voltage to control both the level of reactive energy and the surface sputtering rate to control the compound formation rate resulting in control over both the degree to which the finished film is composed of compound molecules rather than vapor atoms, and also the stoichiometry, and to control the film properties of adhesion, packing density and crystal grain size.

14. The method of claim 1 further comprising the initial step of:
  preconditioning said substrate surface prior to the deposition step by bombarding it with said second ion beam, said preconditioning having the steps of:
  forming said second ion beam solely from an inert gas and solely positioning said substrate surface to receive said beam at an angle with the surface normal of between 25 and 60 degrees, to clean said surface by sputtering action on all portions of the substrate surface.

15. The method of claim 14 further comprising the step of:
  forming said second ion beam solely from an inert gas;
  positioning said substrate surface to be struck by said ion beam at an angle with the surface normal of between 80 and 90 degrees to smooth the surface by sputtering action on surface asperities and rough areas.

16. The method of claim 1 further comprising the step of:
  preparing the vacuum chamber and all interior hardware components prior to the deposition step by high temperature bakeout followed by cooldown to room temperature; and
  evacuating said vacuum chamber to a pressure of less than one nano-torr.

17. The method of claim 1 further comprising the steps of:
  measuring each said solid thin film's thickness growth using an optical thin film deposition controller, and
  interrupting the film growth in response to said measured thickness exceeding a predetermined limit.

18. The method of claim 1 further comprising the added step after said chamber preparation of:
  positioning said substrate shutter mask over the substrates;
  using said first ion beam to sputter a metal target held by said target holding structure to provide sputtered metal vapor;
  adjusting the ion beam current to permit the sputtered metal vapor to condense on line of sight chamber walls and hardware fixtures within the chamber to minimize the effects of dust particle movements during the deposition process.

19. The method of claim 1 further comprising the steps of:
  measuring each said solid thin film's thickness growth using a quartz crystal thin film ellipsometry controller; and
  interrupting the film growth in response to said measured thickness exceeding a predetermined limit.

20. An apparatus for fabricating multilayer optical films on a substrate having a surface to be coated comprising:
  a vacuum chamber having a resealable means for entry, inspection and loading;
  a means for evacuating said vacuum chamber when said means for entry is sealed;
  a turret for holding at least one target, a turret rotating means for supporting and rotating said turret to a predetermined rotational position within said chamber on a turret rotational axis, said turret rotating means being further characterized to oscillate said turret back and forth, over a small angluar excursion about said turret rotational axis;
  a substrate holder within said vacuum chamber for holding at least one substrate;
  means for rotating said substrate holder on a first and second rotational axis;
  a means within said vacuum chamber subsequent to sealing and evacuation, for forming, directing and controlling a first ion beam to bombard a target surface on aid target to produce a vapor cloud composed of said target material by the process of sputtering; said vapor cloud being directed toward said substrate while said substrate holder is being rotated;

a means within said vacuum chamber for forming a second ion beam from a mixture of inert and reactive gases;

means for rotating said substrate holder on said first rotational axis at a predetermined rotational rate;

means for rotating said substrate holder on said second rotational axis to a first predetermined angle with said substrate holder rotating on said first rotational axis said first predetermined angle being selected to position the surface of said substrates to form a predetermined oblique angle with said second ion beam for cleaning and for smoothing the surface of said substrates;

means for rotating said substrate holder on said second rotational axis to a second predetermined angle, means for rotating and oscillating said substrate holder on said first rotational axis with said second ion beam being directed to bombard said substrate surface simultaneously with said target vapor to produce a chemical reaction between said target vapor and said reactive gases ions to form a chemical compound on the surface of said substrate, the ion density and energy of said first ion beam being controlled independently of the current density and energy of said second ion beam.

21. The apparatus for fabricating multilayer optical films on a substrate of claim 20 wherein said means for rotating said substrate holder on a first rotational axis further comprises:

means for positioning the plane of said substrate surface to be coated to form an acute angle with said second ion beam to permit said second ion beam to impinge and clean the surface of said substrate prior to formation of said multilayer optical films.

* * * * *